United States Patent
Li et al.

(10) Patent No.: US 9,558,999 B2
(45) Date of Patent: Jan. 31, 2017

(54) ULTRA-THIN METAL WIRES FORMED THROUGH SELECTIVE DEPOSITION

(71) Applicant: GLOBALFOUNDRIES INC., Grand Cayman (KY)

(72) Inventors: Juntao Li, Guilderland, NY (US); Chih-Chao Yang, Glenmont, NY (US); Yunpeng Yin, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/025,047

(22) Filed: Sep. 12, 2013

(65) Prior Publication Data
US 2015/0069625 A1    Mar. 12, 2015

(51) Int. Cl.
*H01L 21/768* (2006.01)
*H01L 21/285* (2006.01)
*H01L 21/288* (2006.01)

(52) U.S. Cl.
CPC ..... *H01L 21/76885* (2013.01); *H01L 21/7682* (2013.01); *H01L 21/76846* (2013.01); *H01L 21/76879* (2013.01); *H01L 21/288* (2013.01); *H01L 21/28562* (2013.01); *H01L 21/76834* (2013.01); *H01L 21/76844* (2013.01); *H01L 21/76852* (2013.01)

(58) Field of Classification Search
CPC ............ H01L 21/76879; H01L 21/76844; H01L 21/76852; H01L 21/76885; H01L 21/76883
See application file for complete search history.

(56) References Cited

U.S. PATENT DOCUMENTS

| | | | |
|---|---|---|---|
| 5,429,987 A * | 7/1995 | Allen ........................... | 438/654 |
| 5,585,673 A | 12/1996 | Joshi et al. | |
| 5,695,810 A | 12/1997 | Dubin et al. | |
| 6,083,842 A * | 7/2000 | Cheung ............ | H01L 21/76843 |
| | | | 257/E21.584 |
| 6,323,554 B1 | 11/2001 | Joshi et al. | |
| 6,342,733 B1 | 1/2002 | Hu et al. | |
| 6,706,625 B1 | 3/2004 | Sudijono et al. | |
| 7,790,611 B2 | 9/2010 | Anderson et al. | |
| 7,935,625 B2 | 5/2011 | Kim et al. | |
| 7,977,792 B2 | 7/2011 | Hwang | |
| 7,989,336 B2 * | 8/2011 | Tang ................... | H01L 21/7682 |
| | | | 438/294 |
| 8,310,052 B2 | 11/2012 | Torazawa | |
| 8,431,485 B2 | 4/2013 | Jung et al. | |
| 8,466,056 B2 | 6/2013 | Agarwala et al. | |
| 8,598,677 B2 | 12/2013 | Lee | |

(Continued)

FOREIGN PATENT DOCUMENTS

JP    0811459 A    10/1994
JP    2009182203 A    8/2009

OTHER PUBLICATIONS

International Search Report, Application No. PCT/CN2014/086293, mail date Dec. 12, 2014.

*Primary Examiner* — Stephen W Smoot
*Assistant Examiner* — Sun M Kim
(74) *Attorney, Agent, or Firm* — Scully, Scott, Murphy & Presser, P.C.

(57) ABSTRACT

The embodiments of the present invention relate generally to the fabrication of integrated circuits, and more particularly to a structure and method for fabricating a pair of ultra-thin metal wires in an opening using a selective deposition process.

9 Claims, 12 Drawing Sheets

(56) References Cited

U.S. PATENT DOCUMENTS

| | | | |
|---|---|---|---|
| 2002/0058405 A1* | 5/2002 | Huang | H01L 21/76832 |
| | | | 438/618 |
| 2004/0113279 A1 | 6/2004 | Chen et al. | |
| 2007/0246831 A1* | 10/2007 | Gabric et al. | 257/758 |
| 2008/0081453 A1 | 4/2008 | Kim et al. | |
| 2008/0166839 A1 | 7/2008 | Houston | |
| 2010/0123249 A1 | 5/2010 | Motoyama | |
| 2011/0095434 A1* | 4/2011 | Scheuerlein et al. | 257/773 |
| 2011/0275214 A1* | 11/2011 | Ryan | H01L 21/32139 |
| | | | 438/627 |
| 2013/0154087 A1* | 6/2013 | Yoshimizu | C23C 18/1608 |
| | | | 257/734 |
| 2013/0334691 A1* | 12/2013 | Farooq | H05K 3/423 |
| | | | 257/751 |

\* cited by examiner

ULTRA-THIN METAL WIRES FORMED THROUGH SELECTIVE DEPOSITION

FIELD

The present invention relates generally to the fabrication of integrated circuits, and more particularly, to a structure and method for fabricating ultra-thin back end of line (BEOL) metal wires.

BACKGROUND

Integrated circuit (IC) chips typically include multiple levels of conductive features which are vertically spaced apart and separated by intermediate insulating layers. Interconnections are formed between the levels of conductive features in the chip to provide high wiring density and good thermal performance. The interconnections are formed using lines and vias, which are etched through the insulating layers separating the levels conductive features of the device. The lines and vias are then filled with a conductive material to form interconnect structures (i.e., wires). Typically, a conductive metal, such as copper is used to form the interconnect structures.

Interconnects are commonly formed through a photolithography process that includes the deposition of a patternable masking layer commonly known as photoresist. One preferred photolithographic method of making interconnect structures is the damascene process. A typical damascene process includes: a blanket deposition of a dielectric material; patterning of the dielectric material using photoresist to form openings; deposition of a conductive material onto the substrate in sufficient thickness to fill the openings; and removal of the excessive conductive material from the substrate surface using a chemical reactant-based process, mechanical methods, or a combined chemical mechanical polishing (CMP) techniques.

SUMMARY

According to one embodiment of the present invention, a method of forming a semiconductor device is disclosed. The method may include forming a pair of metal wires in an opening formed in a dielectric layer. The pair of metal wires may be formed through a selective deposition technique. The method may also include forming a pair of liner regions on the sidewalls of the opening adjacent to and contacting the pair of metal wires. The method may also include forming a center region between and contacting the pair of metal wires in the opening. The center region may be formed by selectively growing a pair of diffusion barriers on the pair of metal wires. The pair of diffusion barriers may be separated by a portion of the bottom of the opening. A dielectric region may be formed on the portion of the bottom of the opening and between the pair of diffusion barriers. Alternatively, a dielectric cap may be formed between an upper portion of the pair of diffusion barriers, leaving the region below the dielectric cap unfilled to form an air-gap region. The center region may also be formed by depositing an isolation layer having side portions contacting the pair of metal wires and a bottom portion contacting the bottom of the opening in between. A dielectric region may be formed on the bottom portion of the isolation layer and in between the side portions of the isolation layer. Alternatively, a dielectric cap may be formed between an upper portion of the side portions of the isolating layer, leaving a region defined by the bottom portion of the isolation layer, the side portions of the isolation layer, and the dielectric cap unfilled to form an air-gap region.

In another embodiment of the present invention, a method of forming a semiconductor device is disclosed. The method may include forming a dielectric layer on a semiconductor substrate; forming an opening in the dielectric layer extending from an upper surface of the dielectric layer to an upper surface of the semiconductor substrate; forming a pair of liner regions, having an upper surface that is substantially coplanar with the upper surface of the dielectric layer, on sidewalls of the opening; forming a pair of metal wires on sidewalls of the pair of liner regions; forming a pair of barrier layers on the sidewalls of the metal wires; and forming a dielectric region between the pair of barrier layers. Forming the pair of barrier layers may include forming a pair of diffusion barriers on the sidewalls of the pair of metal wires separated by a portion of the bottom of the opening through a selective deposition process, or forming a conformal isolation layer on the sidewalls of the pair of metal wires and on the bottom of the opening. Alternatively, the forming the dielectric region between the pair of barrier layers may include forming a dielectric cap between an upper portion of the pair of barrier layers and an air-gap region underneath.

In another embodiment of the present invention, a semiconductor structure is disclosed. The structure may include a pair of metal wires in an opening formed in a dielectric layer. The structure may also include a pair of liner regions on the sidewalls of the opening adjacent to and contacting the pair of metal wires and a portion of a bottom of the opening. The structure may also include a center region formed between and contacting the pair of metal wires. The center region may include a pair of diffusion barriers on the sides the pair of metal wires separated by a portion of the bottom of the opening. A dielectric region or a dielectric cap and air-gap region may be present between the pair of diffusions barriers and on the portion of the bottom of the opening. Alternatively, the center region may include an isolation layer having side portions contacting the pair of metal wires and having a bottom portion in between contacting the bottom of the opening. A dielectric region or a dielectric cap and air-gap region may be present between the side portions of the isolation layer and on the bottom portion of the isolating layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

The embodiments of the present invention relate generally to the fabrication of integrated circuits, and more particularly to a structure and method for fabricating back-end-of-line (BEOL) ultra-thin metal wires through a selective deposition process at sub-lithographic widths (i.e., less than 30 nm).

The continual reduction in feature size in integrated circuit (IC) chips has placed ever greater demands on the photolithographic techniques used to form interconnect structures on IC chips and the size of the interconnect schemes and structures themselves. A concept commonly referred to as "pitch" can be used to describe the sizes of the features in conjunction with spaces immediately adjacent thereto. Pitch may be defined as the distance between an identical point in two neighboring features of a repeating pattern in a straight line cross section, thereby including the maximum width of the feature and the adjacent space immediately next to the feature.

Due to factors such as optics and light or radiation wavelength, photolithography techniques tend to have a minimum pitch below which a particular photolithographic technique cannot reliably form features. Thus, the minimum pitch of a photolithographic technique is an obstacle to continued feature size reduction using photolithography. In addition, it is very difficult to fill very narrow trenches in damascene formation of conductive wires, particularly as the width of such wires has decreased through conventional pitch reduction techniques such as pitch multiplication, because of resistivity requirements. Effective resistivity of the trench fill material increases at these dimensions and, additionally, voids may form within the conductive material in the trenches due to the material not spanning completely across the trench width. These voids inherently reduce the amount of conductive material in the line. These limitations have a negative effect (i.e., signal propagation delay) on the overall speed of operation of IC chips.

Embodiments by which to reduce the signal propagation delay of IC devices while forming ultra-thin metal wires at sub-lithographic widths are described in detail below with reference to the accompanying drawings FIGS. 1-7. Process steps and structures common to each of the embodiments are described in detail with reference to FIGS. 1-5, while one embodiment is described in detail with reference to FIGS. 6A-6C, another embodiment is described in detail with reference to FIG. 6D, another embodiment is described in detail with reference to FIGS. 7A-7B, and another embodiment is described in detail with reference to FIG. 7C.

Figure 1:
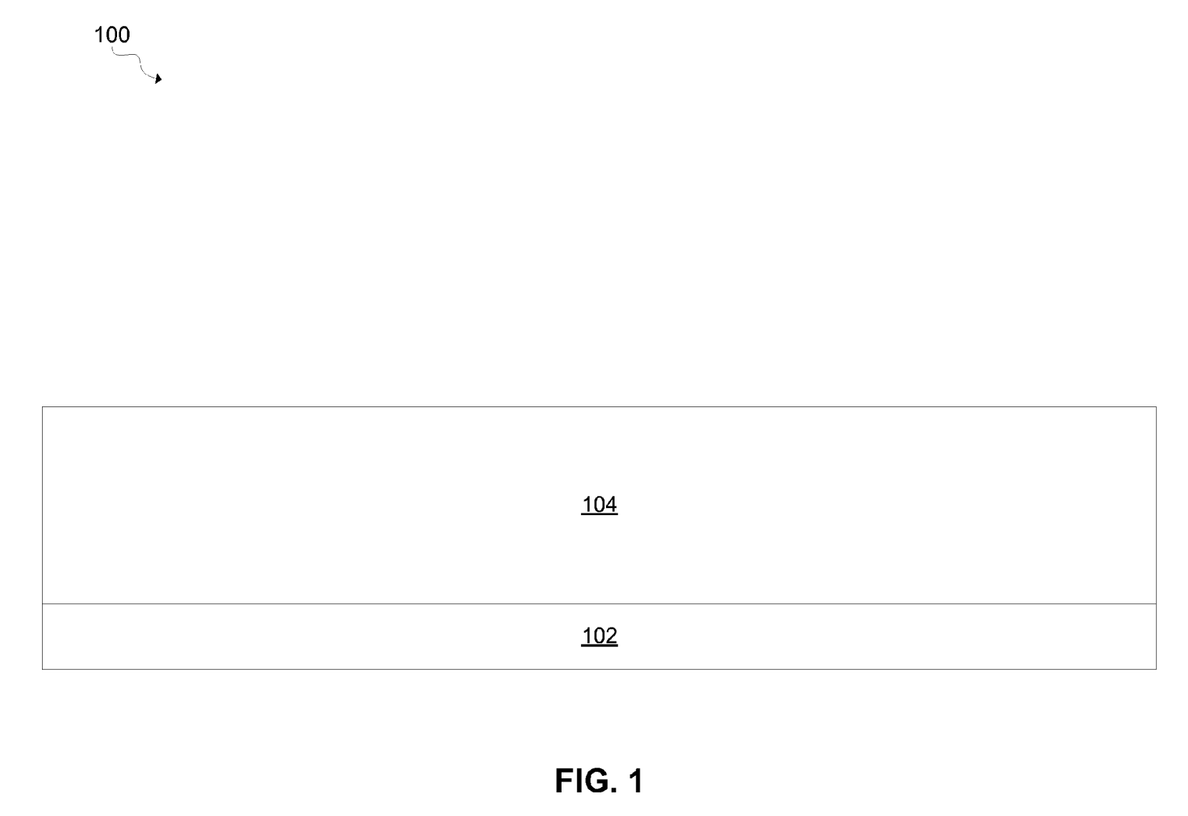
FIG. 1 is a cross sectional view of a dielectric layer formed on a semiconductor substrate, according to an embodiment of the present invention.

Referring to FIG. 1, an initial structure 100 may be used in an embodiment of the present invention. The structure 100 may include a dielectric layer 104 formed over a substrate 102.

The substrate 102 may include a semiconducting material, an insulating layer, a conductive material, or any combination thereof, including multilayered structures. Thus, for example, the substrate 102 can be a semiconducting material such as Si, SiGe, SiC, GaAs, InAs, InP, and other III/V or II/VI compound semiconductors. The substrate 102 may also include a layered substrate such as, for example, Si/SiGe, Si/SiC, or semiconductor-on-insulators (SOIs). When the substrate 102 contains an insulating layer, the insulating layer may be composed of an organic insulator, an inorganic insulator, or a combination thereof including multilayers.

When the substrate 102 is composed of a conductive material, the substrate 102 may include, for example, polySi, an elemental metal, alloys of elemental metals, a metal silicide, a metal nitride, and combinations thereof, including multilayers. When the substrate 102 is composed of a semiconductor material, one or more semiconductor devices such as complimentary metal oxide semiconductor (CMOS) devices can be fabricated thereon. For clarity, the one or more semiconductor devices are not shown in the drawings of the present application.

The dielectric layer 104 may be formed utilizing a conventional deposition process including, but not limited to, depositing dielectric material using molecular beam epitaxy (MBE), chemical vapor deposition (CVD), plasma enhanced CVD (PECVD), atomic layer deposition (ALD), evaporation, physical vapor deposition (PVD), chemical solution deposition, and other like deposition processes. In one embodiment, a dielectric material may be deposited on the substrate 102 using a blanket deposition process and then planarized using a conventional process such as, for example, chemical mechanical planarization (CMP) to form the dielectric layer 104. The dielectric layer 104 may be composed of one or more layers of dielectric materials that may be, but not necessarily always, in direct contact with each other.

In an embodiment, the dielectric layer 104 may be composed of a low-k dielectric material including, but not limited to, an oxide and/or silicates. A "low-k" material is a dielectric material with a lower dielectric constant relative to silicon dioxide ($SiO_2$), which is 3.9 (i.e., the ratio of the permittivity of $SiO_2$ divided by the permittivity of a vacuum). Some examples of suitable low-k dielectric materials that may be used to form the dielectric layer 104 include, but are not limited to: $SiO_2$; silsesquioxanes; C doped oxides (i.e., organosilicates) that include atoms of Si, C, O and H; and thermosetting polyarylene ethers. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In another embodiment, the dielectric layer 104 may be composed of an ultra low-k dielectric material having a dielectric constant, k, of 2.7 or less. The dielectric layer 104 may be porous or nonporous. The dielectric layer 104 may be composed of materials including, but not limited to, organic polymers, low-k PECVD films containing Si, C, O, and H, and spin-on organosilicate glasses which have k values in the 2.7 to 2.0 range or lower. It is understood, however that other materials having an ultra low-k dielectric constant may be employed. The dielectric layer 104 may also include multiple layers of dielectric material in any combination known in the art. The dielectric layer 104 may have a thickness ranging from approximately 100 nm to approximately 800 nm.

Figure 2:
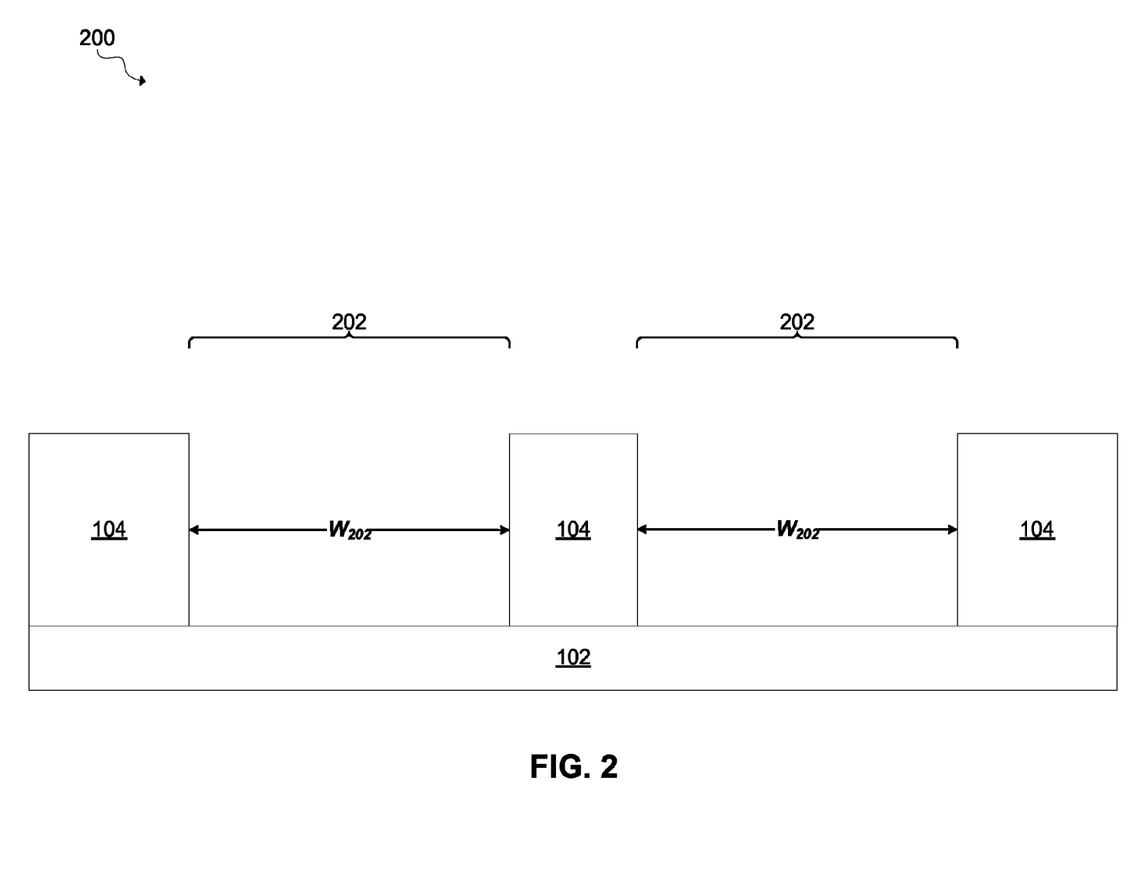
FIG. 2 is a cross sectional view illustrating the formation of openings in a dielectric layer, according to an embodiment of the present invention.

Referring now to FIG. 2, a structure 200 illustrates forming a pair of openings 202 (hereinafter "openings") in the dielectric layer 104. The openings 202 may be formed by depositing a photoresist material (not shown) on an upper surface of the dielectric layer 104. The photoresist material (not shown) may be patterned by a photolithography process, to provide a photoresist pattern and then etched via one or more steps to form the openings 202. The etching process may include a dry etching process such as reactive ion etching (RIE), ion beam etching, or plasma etching. The patterned photoresist may be removed after the dielectric layer 104 is etched and the openings 202 are formed. The openings 202 may have a width ($W_{202}$) ranging from approximately 30 nm to approximately 120 nm. In one embodiment, the openings 202 may have a width ($W_{202}$) of approximately three times the total width of a set of features formed on one sidewall of the openings 202 (i.e., the width of one of a pair of liner regions, the width of one of a pair of metal wires, and the width of one of a pair of diffusion barriers (see FIGS. 4-6)).

Figure 3:
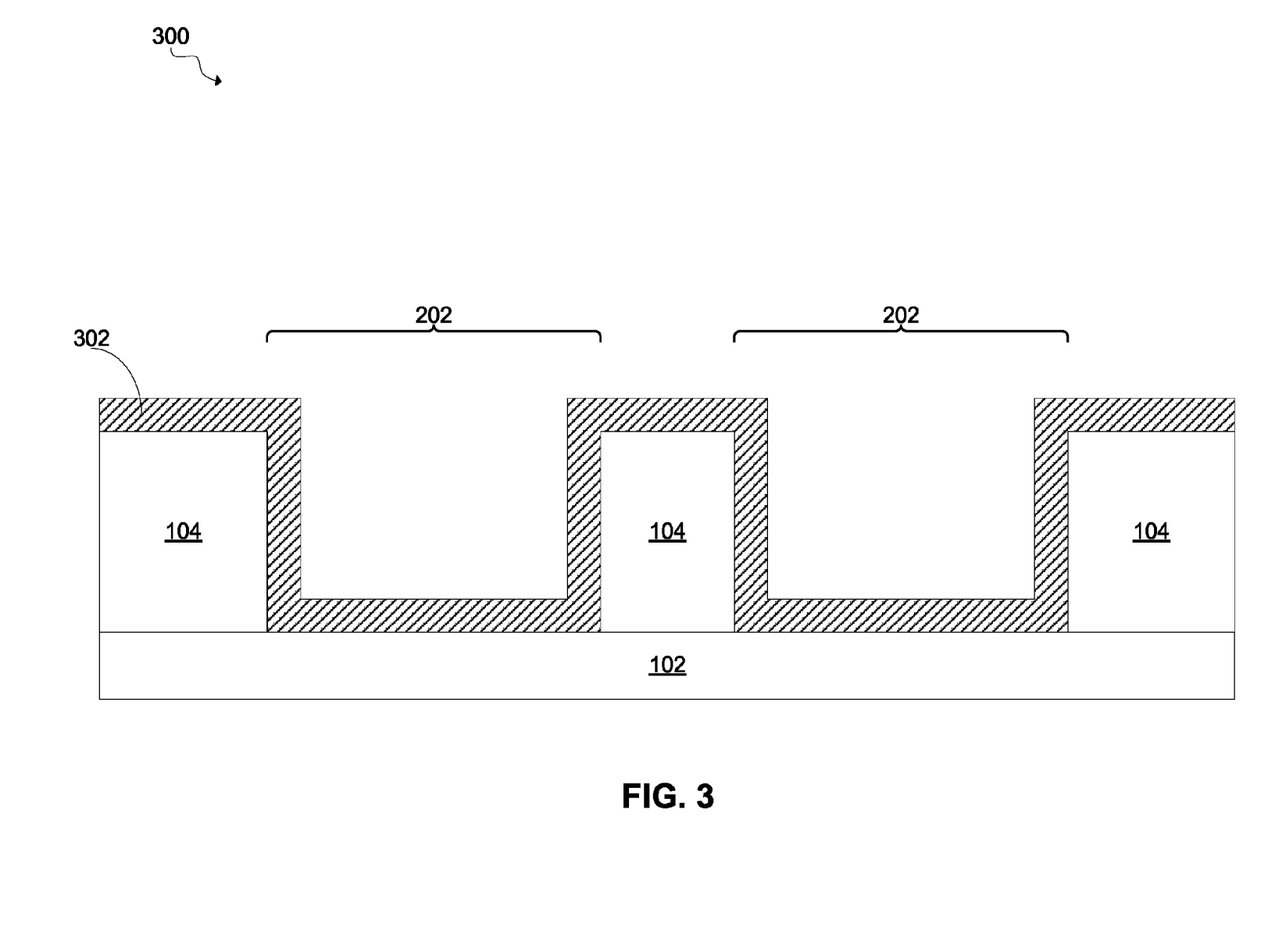
FIG. 3 is a cross sectional view illustrating the formation of conformal liner layer, according to an embodiment of the present invention.

Referring now to FIG. 3, a structure 300 illustrates forming a conformal liner layer 302 on the openings 202 and on horizontal upper surfaces of the dielectric layer 104. The conformal liner layer 302 may have a thickness ranging from approximately 1 nm to approximately 30 nm. The conformal liner layer 302 may be composed of a material that can serve as a barrier to prevent a conductive material from diffusing there through. Illustrative examples of such materials include a refractory metal, such as Ti, Ta, W, Ru, a Co, or nitrides thereof (e.g., TiN, TaN, WN, RuN, and CoN). The conformal liner layer 302 may be formed by a deposition process known in the art including, but not limited to, CVD, PECVD, sputtering, chemical solution deposition, or plating.

Figure 4:
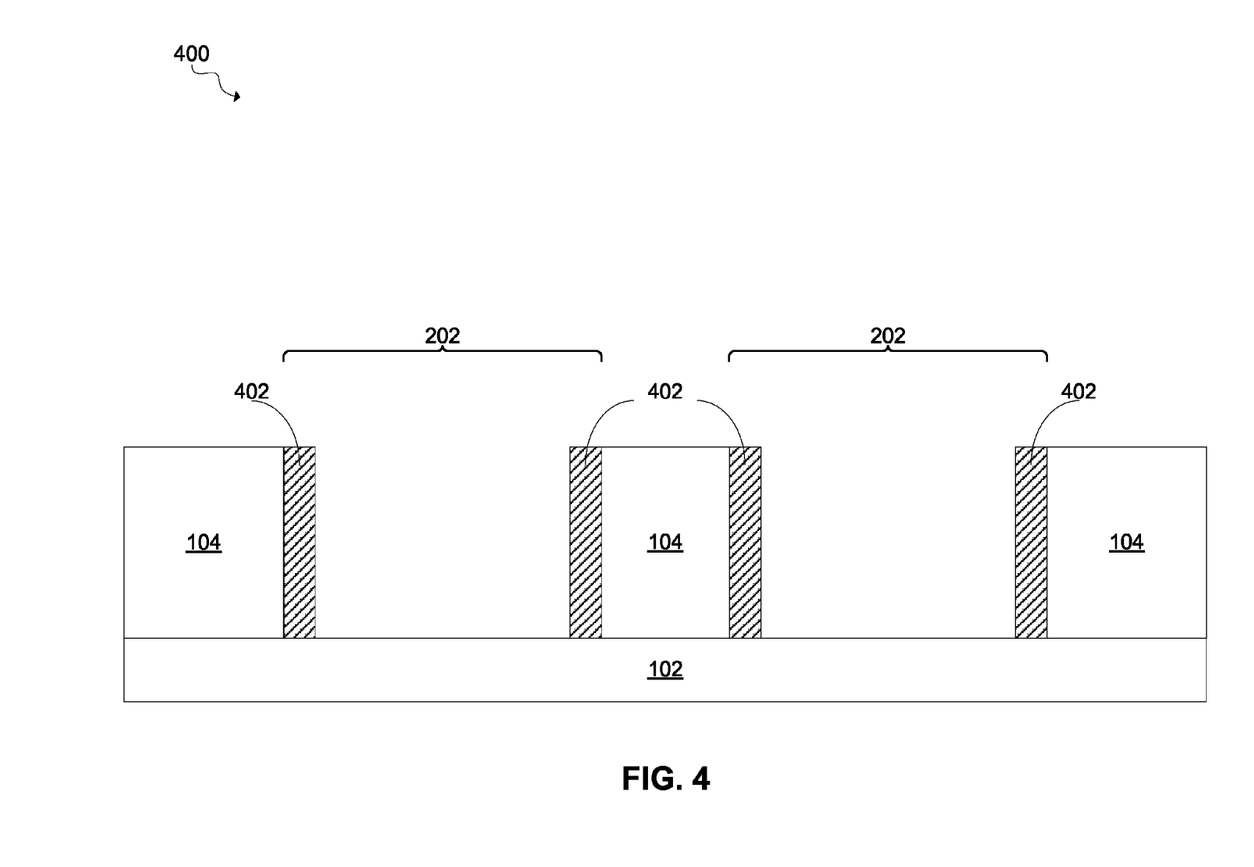
FIG. 4 is a cross sectional view illustrating the formation of liner regions, according to an embodiment of the present invention.

Referring now to FIG. 4, a structure 400 illustrates the directional removal of the conformal liner layer 302 (FIG. 3.) from the horizontal upper surfaces of the dielectric layer 104 and a bottom of the openings 202 to form a pair of liner regions 402 (hereinafter "liner regions") on the sidewalls of each of the openings 202. In one embodiment, an anisotropic etch, such as RIE, may be performed to remove a portion of the conformal liner layer 302 (FIG. 3) from of the bottom of the openings 202 and the horizontal upper surfaces of the dielectric layer 104. The anisotropic etch may expose an upper surface of the semiconductor substrate 102. The liner regions 402 may have a width ranging from appoximately 1 nm to approximately 30 nm. The liner regions 402 may have an upper surface that is substantially coplanar with the upper surface of the dielectric layer 104.

Figure 5:
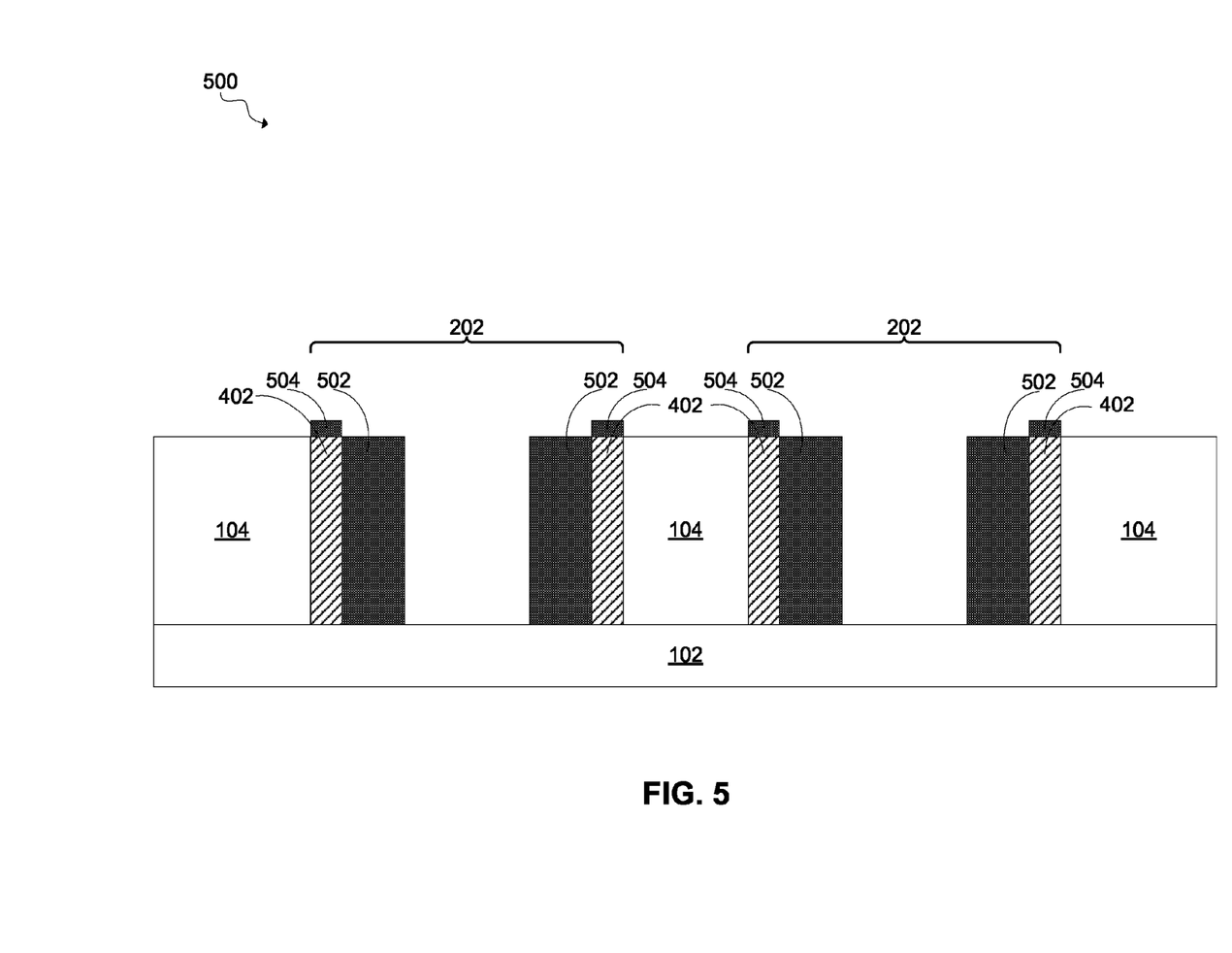
FIG. 5 is a cross sectional view illustrating the formation of metal wires, according to an embodiment of the present invention.

Referring now to FIG. 5, a structure 500 illustrates the forming a pair of metal wires or conductors 502 (hereinafter "metal wires") on the semiconductor substrate 102 and on sidewalls of the liner regions 402 in each of the openings 202. In one embodiment, the metal wires 502 may be selectively formed through the primarily lateral formation of conductive material outward from the sidewalls of the liner regions 402. This primarily lateral growth of the metal wires 502 may be accomplished through a selective deposition process in which the material used to form the metal wires 502 only forms on exposed surfaces of features that contain a metal (e.g., the liner regions 402) and not on dielectric materials (e.g., the dielectric layer 104, and the semiconductor substrate 102). The selective deposition techniques according to embodiments of the present invention involve self-complimentary materials and are self-limiting depositions of a metal from a reactive vapor phase compound of the metal exclusively on an exposed metal. When forming the metal wires 504, excess metal 504 may form on the upper surface of the liner regions 402 at a slower rate than on the sidewalls of the liner regions 402 and may be removed later through a planarization process. The metal wires 502 may be formed utilizing a deposition process including, for example, electroless deposition, CVD, PECVD, low pressure CVD, and ALD. The metal wires 502 may be composed of a material with a low electrical resistance ("low-R material") such as, for example, Co, Ru, CoWP, Cu, and W. In one embodiment, the metal wires 502 may have a width of less than approximately 20 nm.

Figure 6A:
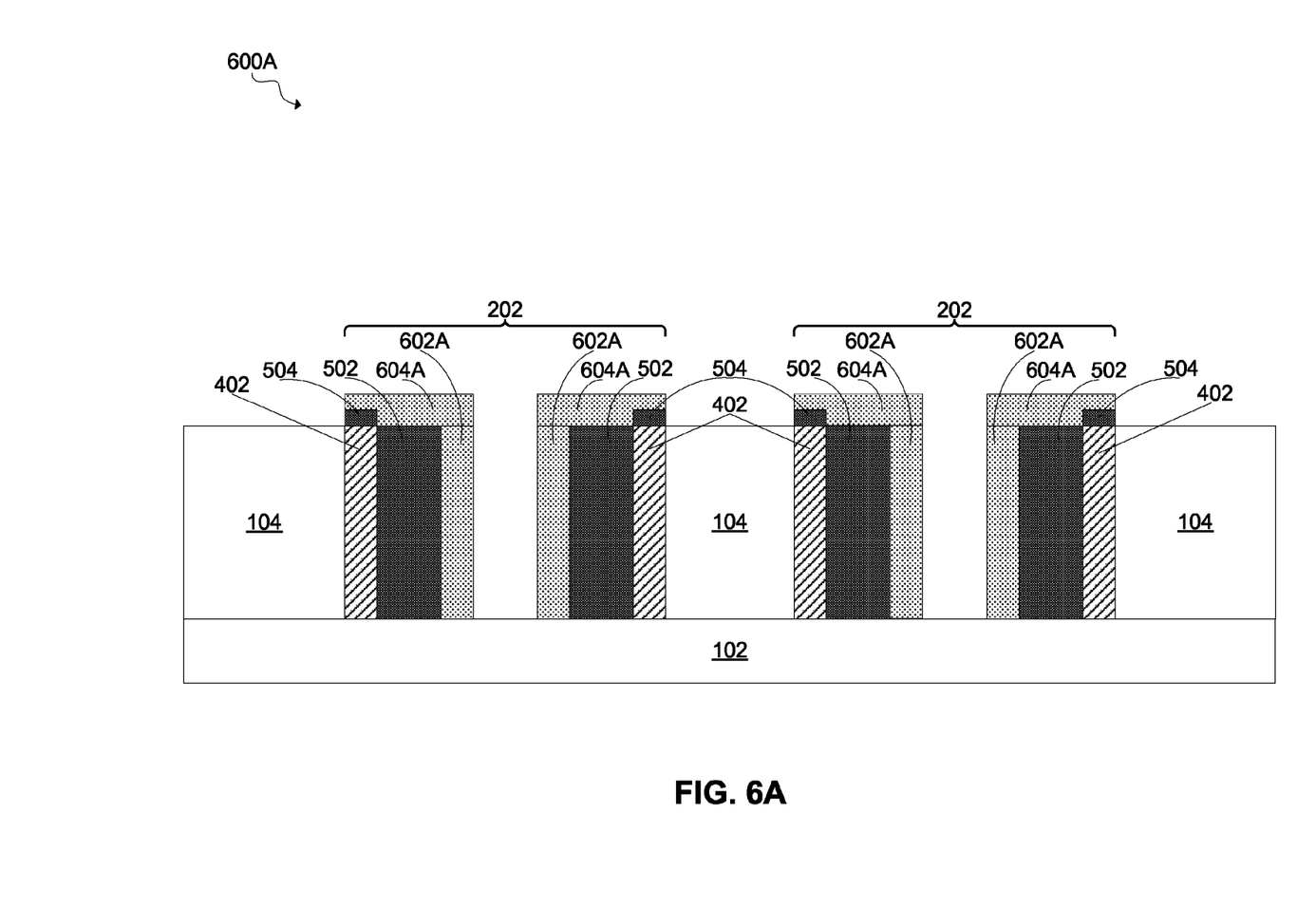
FIG. 6A is a cross sectional view illustrating the formation of diffusion barriers, according to an embodiment of the present invention.

Referring now to FIG. 6A and in one embodiment, a structure 600A illustrates forming a pair of diffusion barriers 602A (hereinafter "diffusion barriers") on sidewalls of the metal wires 502 in each of the openings 202. The diffusion barriers 602A may be formed by a selective deposition process in which the material used to form the diffusion barriers 602A only forms on exposed surfaces of features that contain a metal (e.g., the metal wires 502 and excess portions 504) and not on dielectric materials (e.g., the dielectric layer 104, and the semiconductor substrate 102). When forming the diffusion barriers 602A, an excess barrier portion 604A may form on the upper surface of the metal wires 502 and excess metal 504 at a slower rate than on the sidewalls of the metal wires 502 and may be removed later through a planarization process. The diffusion barriers 602A may be formed utilizing a deposition process including, for example, CVD, PECVD, low pressure CVD, and ALD. The diffusion barriers 602A may be composed of a material that can serve as a barrier to prevent a conductive material from diffusing there through. Illustrative examples of such materials include a refractory metal, such as Ti, Ta, W, Ru, a Co, or nitrides thereof (e.g., TiN, TaN, WN, RuN, and CoN). It should be noted that the diffusion barriers 602A may have a similar composition as the liner regions 402 in some embodiments, and a different composition in other embodiments. The diffusion barriers 602A may have a width ranging from approximately 1 nm to approximately 30 nm. The diffusion barriers 602A are physically separated from the liner regions 402.

Figure 6B:
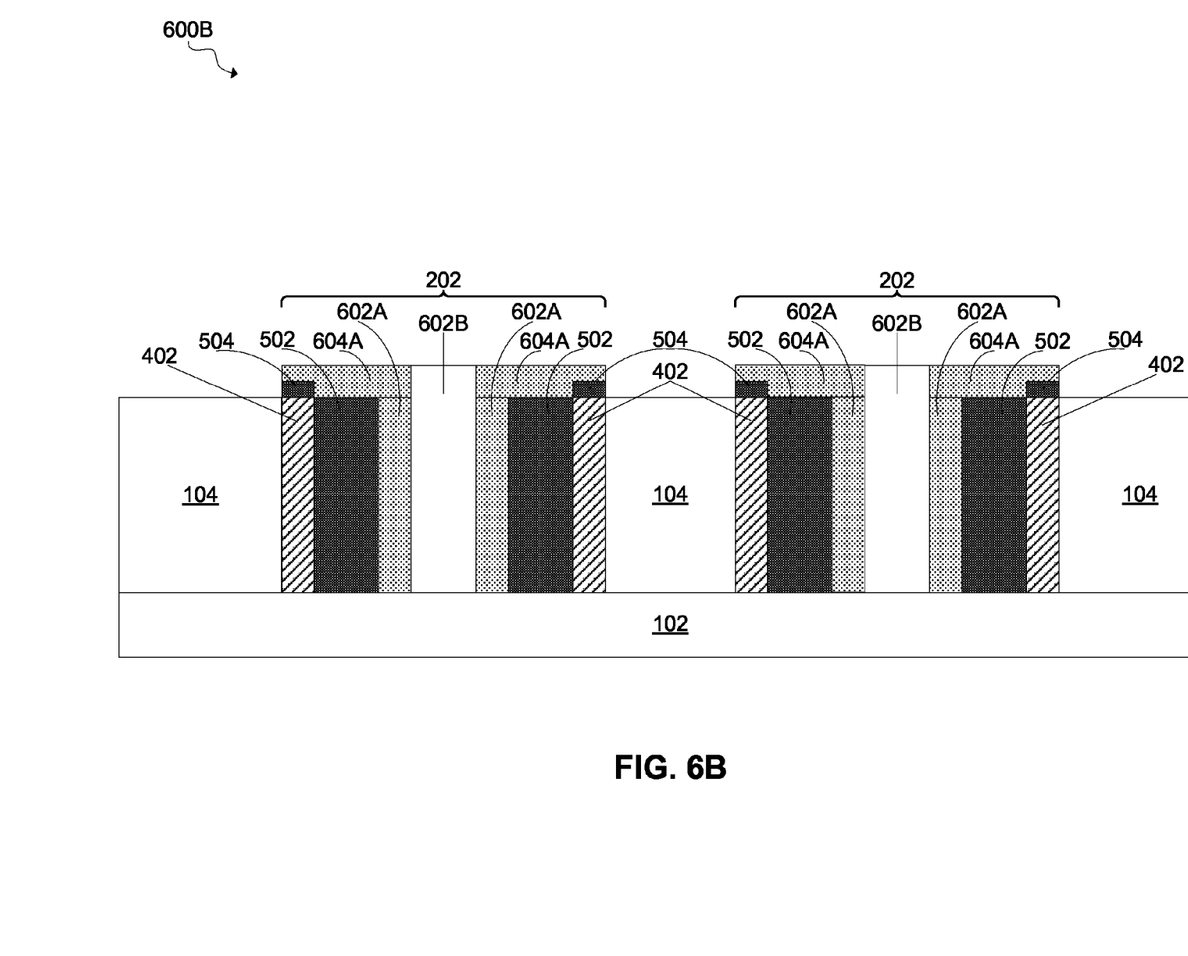
FIG. 6B is a cross sectional view illustrating the formation of dielectric regions, according to an embodiment of the present invention.

Referring now to FIG. 6B, a structure 600B illustrates forming a dielectric region 602B on the semiconductor substrate 102 and on sidewalls of the diffusion barriers 602A in each of the openings 202. The dielectric region 602B may be substantially similar to, and formed using the same deposition processes and techniques as described above with reference to, the dielectric layer 104. In an embodiment, the dielectric region 602B may contain pockets of unfilled areas that form insulating air pockets. The dielectric region 602B may have a width ranging from approximately 10 nm to approximately 40 nm.

Figure 6C:
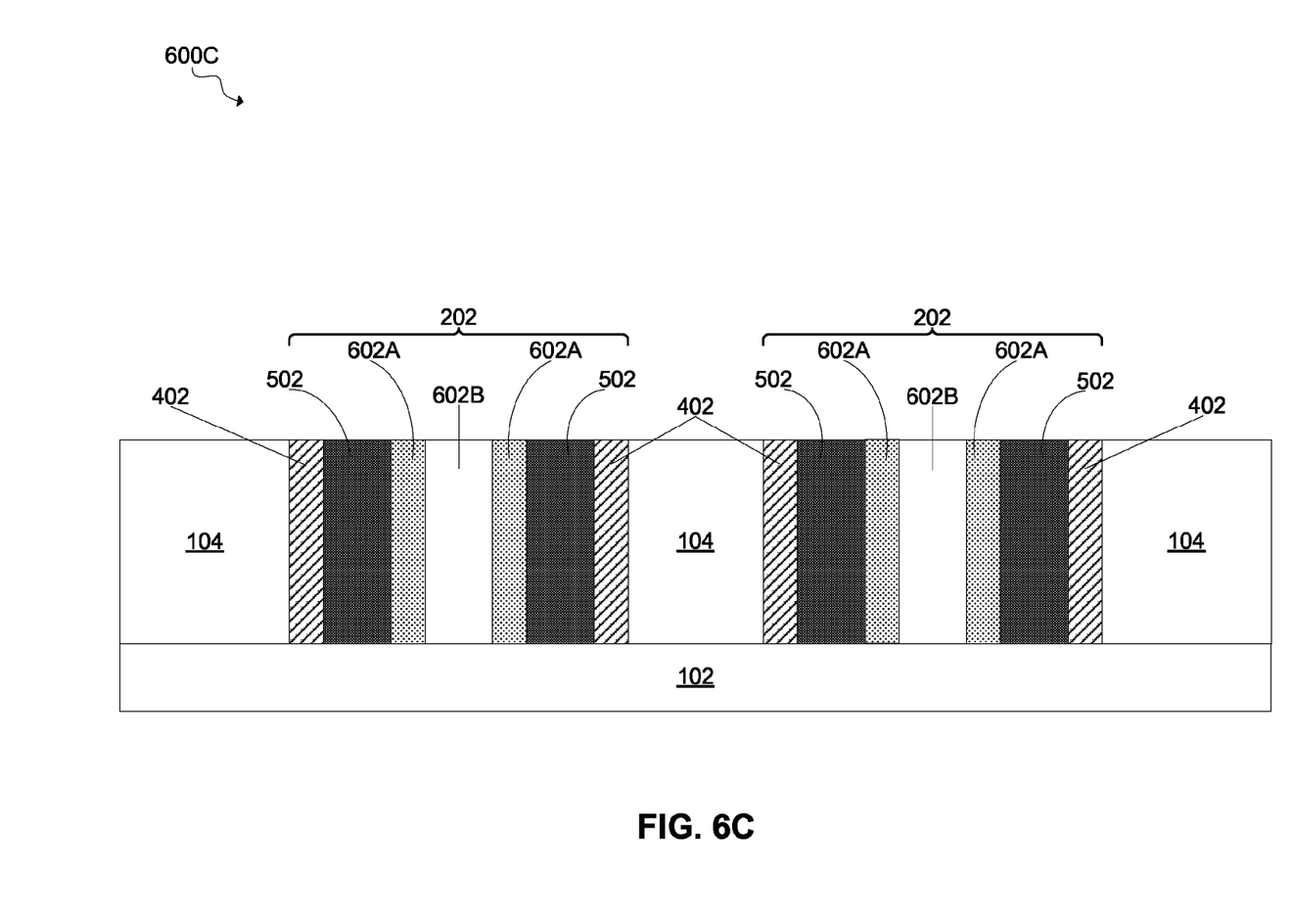
FIG. 6C is a cross sectional view illustrating the removal of portions of the metal wires, the diffusion barriers, and the dielectric regions, according to an embodiment of the present invention.

Referring now to FIG. 6C, a structure 600C illustrates performing a planarization process to remove the excess metal 504 (FIG. 6B), the excess barrier portions 604A (FIG. 6B), and an upper portion of the dielectric region 602B. In one embodiment, conventional planarization process, such as CMP, may be used. In an embodiment, the planarization process may be performed so that the metal wires 502, the diffusion barriers 602A, and the dielectric region 602B each have an upper surface that is substantially coplanar with the upper surface of the dielectric layer 104 and the upper surface of the liner regions 402.

Figure 6D:
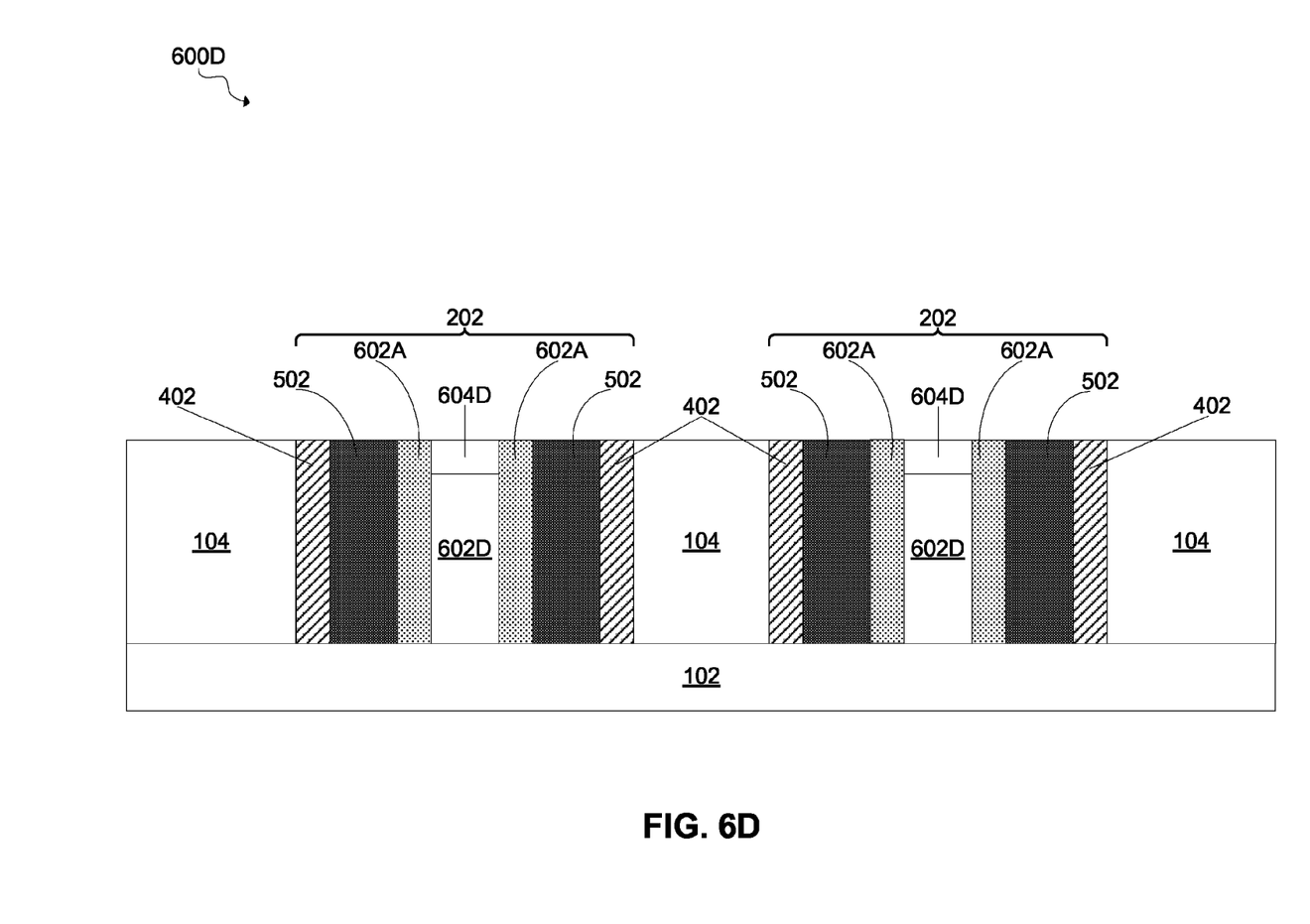
FIG. 6D is a cross sectional view illustrating the formation of air-gap regions, according to an embodiment of the present invention.

Referring now to FIG. 6D, and in another embodiment, a structure 600D illustrates forming an air-gap region 602D between the sidewalls of the diffusion barriers 602A. The air-gap region 602D may be formed by depositing a dielectric layer (not shown) over the structure 600C (FIG. 6C) that extends across, but does not fill, an open portion of each of the openings 202 between the sidewalls of the diffusion barriers 602A. The dielectric layer (not shown) may have a composition that is substantially similar to the dielectric layer 104 and may be formed by a deposition process known in the art including, but not limited to, CVD, PECVD, sputtering, chemical solution deposition, or plating. A portion of the dielectric layer (not shown) may then be removed through a planarization process, such as, but not limited to CMP, so that a dielectric cap 604D remains between the sidewalls of the diffusion barriers 602A. The dielectric cap 604D may have an upper surface that is substantially coplanar with the upper surface of the dielectric layer 104. The dielectric cap 604D may have a width ranging from approximately 10 nm to approximately 40 nm. The dielectric cap 604D may seal off and insulate the air-gap region 602D from the exterior environment.

Other embodiments, which incorporate the process steps and structures described in detail with reference to FIGS. 1-5, are described in detail below with reference to FIGS. 7A-7B and FIG. 7C.

Figure 7A:
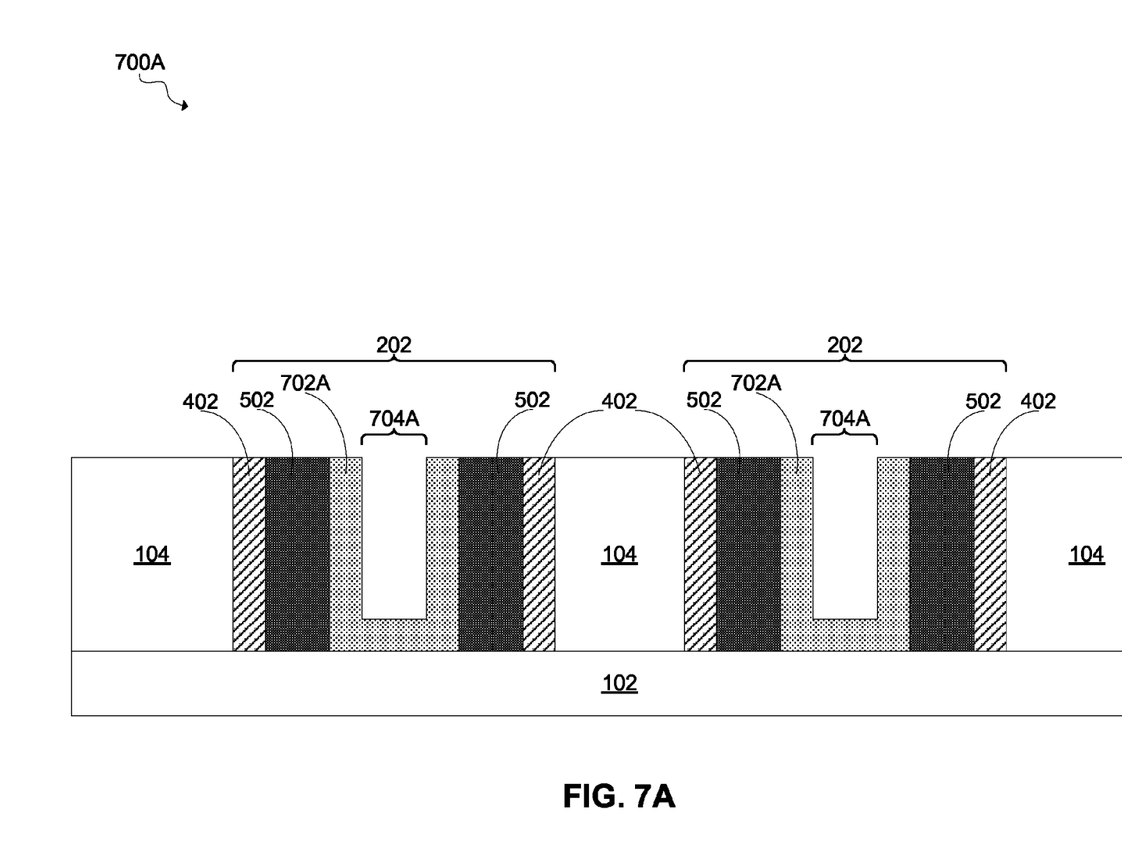
FIG. 7A is a cross section view illustrating the formation of isolation liners, according to an embodiment of the present invention.

Referring now to FIG. 7A, a structure 700A illustrates forming an isolation liner 702A on the bottom surface of the openings 202 and on the sidewalls of the metal wires 502. The isolation liner 702A may be formed by conformally depositing an isolation liner material (not shown) having a thickness ranging from approximately 1 nm to approximately 30 nm on the dielectric layer 104, the excess metal 504 (FIG. 5), the metal wires 502, and bottom surface of the openings 202. Subsequently, a portion of the isolation liner material (not shown) along with the excess metal 504 (FIG. 5) may be removed from upper surfaces of the dielectric layer 104, the liner regions 402, and the metal wires 502 through a planarization process, such as CMP, leaving the isolation liner 702A present on the semiconductor substrate 102 and sidewalls of the metal wires 502. The isolation liner 702A may be substantially "U" shaped, having an open region 704A defined by a horizontal bottom surface and interior sidewalls. The isolation liner 702A may be composed of a low-k dielectric material such as, for example, N-Blok, PECVD Oxide, $SiO_2$, $Si_xN_y$, SiC, $SiC_xN_yH_z$, flowable oxide, TEOS, and polymide. The isolation liner 702A is physically separated from the liner regions 402. The isolation liner 702A may have an upper surface that is substantially coplanar with the upper surface of the dielectric layer 104.

Figure 7B:
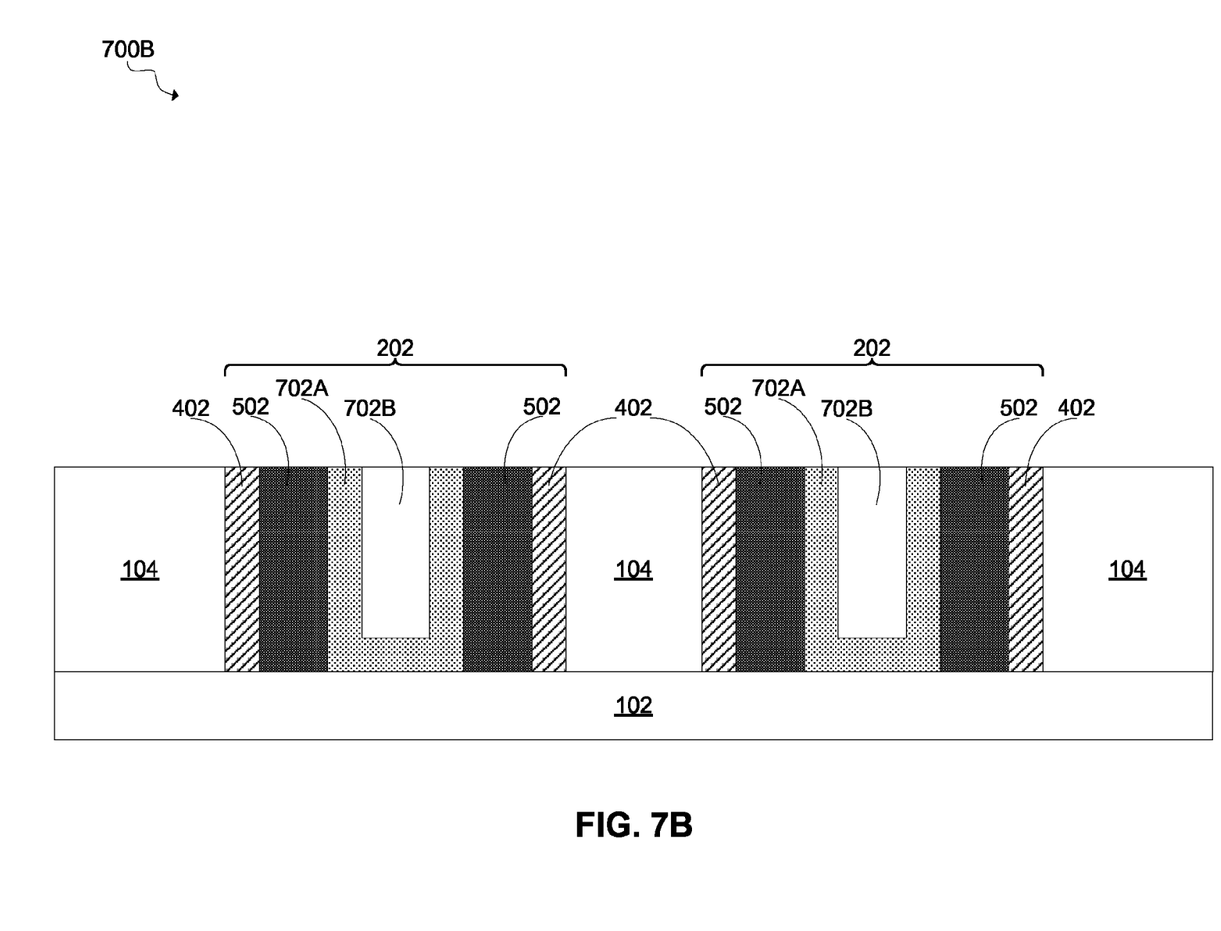
FIG. 7B is a cross sectional view illustrating the formation of dielectric regions, according to an embodiment of the present invention.

Referring now to FIG. 7B, a structure 700B illustrates forming a dielectric region 702B in the open region 704A (FIG. 7A) of the isolation liner 702A. The dielectric region 702B may be substantially similar to, and formed using the same deposition processes and techniques as described above with reference to, the dielectric layer 104. The dielectric region 702B may have an upper surface that is substantially coplanar with the upper surface of the dielectric layer 104. The dielectric region 702B may have a width ranging from approximately 10 nm to approximately 40 nm.

Figure 7C:
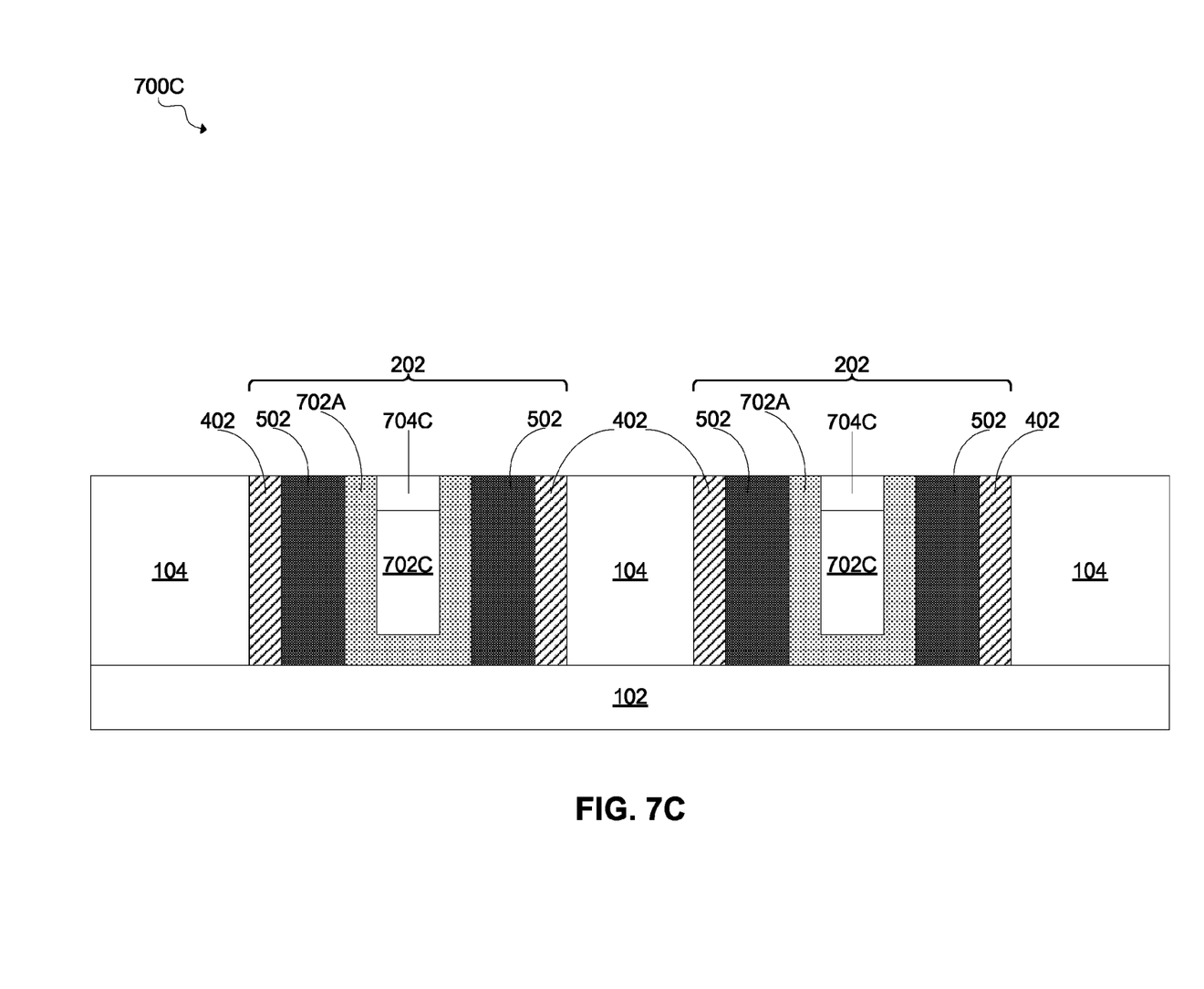
FIG. 7C is a cross sectional view illustrating the formation of air-gap regions, according to an embodiment of the present invention.

Referring now to FIG. 7C, and in another embodiment, a structure 700C illustrates forming an air-gap region 702C in the open portion 704A (FIG. 7A) of the isolation liner 702A. The air-gap region 702C may be formed by depositing a dielectric layer (not shown) over the structure 700A (FIG. 7A) that extends across, and does not fill, the open portion 704A (FIG. 7A). The dielectric layer (not shown) may have a composition that is substantially similar to the dielectric layer 104 and may be formed by a deposition process known in the art including, but not limited to, CVD, PECVD, sputtering, chemical solution deposition, or plating. A portion of the dielectric layer (not shown) may then be removed through a planarization process, such as, but not limited to CMP, so that a dielectric cap 704C remains between the interior sidewalls of the isolation layer 702A. The dielectric cap 704C may have an upper surface that is substantially coplanar with the upper surface of the dielectric layer 104. The dielectric cap 704C may have a width ranging from approximately 10 nm to approximately 40 nm. The dielectric cap 704C may seal off and insulate the air-gap region 702C from the exterior environment.

As discussed above, embodiments of the present invention may allow for the formation of ultra-thin metal wires at sub-40 nm pitches. These ultra-thin metal wires may show fewer defects and may also be made with a simple integration into process flows. It is also envisioned that embodiments of the present invention may be suitable for pattern density multiplication techniques with metal wires self-aligned to each other.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor device, the method comprising:
   forming a conformal liner layer within an opening provided within a dielectric material and on a horizontal upper surface of the dielectric material;
   removing the conformal liner layer from a bottom of the opening and from the horizontal upper surface to form a liner region along each sidewall of the opening;
   forming a pair of metal wires in said opening formed in said dielectric material by a selective deposition technique that includes laterally growing each of said pair of metal wires from a sidewall surface of each of the liner regions in said opening, wherein a first metal wire of the pair of metal wires directly contacts a sidewall surface of one of the liner regions and a second metal wire of the pair of metal wires directly contacts a sidewall surface of another of the liner regions; and
   forming a center region in the opening and on each sidewall surface of said pair of metal wires, wherein a bottommost surface of each metal wire is coplanar with bottommost surfaces of each liner region, the center region and the dielectric material.

2. The method of claim 1, wherein the forming the center region in the opening comprises:
   forming a pair of diffusion barriers on the pair or metal wires through a selective deposition technique, the pair of diffusion barriers being separated by a portion of the bottom opening; and
   forming a dielectric region on the portion of the bottom of the opening.

3. The method of claim 1, wherein the forming the center region in the opening comprises:
   forming a pair of diffusion barriers on the pair or metal wires through a selective deposition technique, the pair of diffusion barriers being separated by a portion of the bottom opening;
   forming a dielectric cap between an upper portion of the pair of diffusion barriers.

4. The method of claim 1, wherein the forming the center region in the opening comprises:
   forming a conformal layer over the dielectric material, the pair of liner regions, the pair of metal wires, and the bottom of the opening;
   removing a portion of the conformal layer from an upper surface of the dielectric material, an upper surface of the pair of liner regions, and an upper surface of the pair of metal wires to form an isolation layer having side portions contacting the pair of metal wires and a bottom portion in between contacting the bottom of the opening; and
   forming a dielectric region on the bottom portion of the isolation layer and between the side portions of the isolation layer.

5. The method of claim 1, wherein the forming the center region in the opening comprises:
   forming a conformal layer over the dielectric material, the pair of liner regions, the pair of metal wires, and the bottom of the opening;
   removing a portion of the conformal layer from an upper surface of the dielectric material, an upper surface of the pair of liner regions, and an upper surface of the pair of metal wires to form an isolation layer having side portions contacting the pair of metal wires and a bottom portion in between contacting the bottom of the opening; and
   forming a dielectric cap between an upper portion of the side portions of the isolation layer; and
   leaving a region below the dielectric cap unfilled to form an air-gap region defined by the side portions of the isolation layer, the bottom portion of the isolation layer, and the dielectric cap.

6. A method of forming a semiconductor device, the method comprising:
   forming a dielectric layer on a substrate;
   forming an opening in the dielectric layer, the opening having sidewalls and extending from an upper surface the dielectric layer to an upper surface of the substrate;
   forming a conformal liner layer within the opening and on the upper surface of the dielectric layer;
   removing the conformal liner layer from the upper surface of the substrate and from the upper surface the dielectric layer to form a pair of liner regions on the sidewalls of the opening, the pair of liner regions having an upper surface that is substantially coplanar with the upper surface of the dielectric layer and having sidewalls;
   forming a pair of metal wires on the sidewalls of the pair of liner regions by a selective deposition technique that includes laterally growing each of said pair of metal wires from a sidewall surface of each of the liner regions in said opening, the pair of metal wires having sidewalls;
   forming barrier regions on the sidewalls of the pair of metal wires; and
   forming a dielectric region between the barrier regions, wherein a bottommost surface of each metal wire is coplanar with bottommost surfaces of each liner region, each barrier region, the dielectric region and the dielectric material.

7. The method of claim 6, wherein the forming the barrier regions on the sidewalls of the pair of metal wires comprises:
   using a selective deposition technique to deposit a pair of diffusion barriers on the pair of metal wires so that a portion of a bottom of the opening remains exposed between the pair of diffusion barriers.

8. The method of claim 6, wherein the forming the dielectric region on the sidewalls of the pair of metal wires comprises:
   filling a gap between the pair of metal wires with a dielectric material.

9. The method of claim 6, wherein the forming the dielectric region between the barrier regions comprises:

forming a dielectric cap between an upper portion of the barrier regions and leaving a region below said dielectric cap unfilled to form an air-gap region.

* * * * *